United States Patent
Sato et al.

(10) Patent No.: US 11,196,334 B2
(45) Date of Patent: Dec. 7, 2021

(54) CURRENT SENSE CIRCUIT

(71) Applicant: Rohm Co., Ltd., Kyoto (JP)

(72) Inventors: Yoshinori Sato, Kyoto (JP); Satoru Nate, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 17 days.

(21) Appl. No.: 16/634,631

(22) PCT Filed: May 24, 2018

(86) PCT No.: PCT/JP2018/019967
§ 371 (c)(1),
(2) Date: Jan. 28, 2020

(87) PCT Pub. No.: WO2019/026398
PCT Pub. Date: Feb. 7, 2019

(65) Prior Publication Data
US 2021/0099091 A1    Apr. 1, 2021

(30) Foreign Application Priority Data
Jul. 31, 2017    (JP) .............................. JP2017-148237

(51) Int. Cl.
*H02M 3/335*    (2006.01)
*H02M 1/00*    (2006.01)
(Continued)

(52) U.S. Cl.
CPC ........ *H02M 1/0009* (2021.05); *G01R 19/165* (2013.01); *H02M 1/00* (2013.01);
(Continued)

(58) Field of Classification Search
CPC .. H02M 3/33515; H02M 1/00; H02M 1/0009; H02M 3/33507; H02M 3/335155; G01R 19/165; H03K 17/687
See application file for complete search history.

(56) References Cited

U.S. PATENT DOCUMENTS

| 4,819,118 A | * | 4/1989 | Mueller | ................ | H02H 6/005 |
| | | | | | 361/103 |
| 5,757,214 A | * | 5/1998 | Stoddard | .............. | H01H 47/325 |
| | | | | | 323/282 |

(Continued)

FOREIGN PATENT DOCUMENTS

| JP | 2014-79155 | 5/2014 |
| JP | 2016-82818 | 5/2016 |

OTHER PUBLICATIONS

Japan Patent Office, International Search report for PCT/JP2018/019967 dated Oct. 7, 2018.

*Primary Examiner* — Alex Torres-Rivera
(74) *Attorney, Agent, or Firm* — Fish & Richardson P.C.

(57) ABSTRACT

A current limiter 200 (corresponding to an example of a current detection circuit) has a comparator 210 and a variable delay unit 220. The comparator 210 switches a comparison signal OCP from a low level to a high level when the current to be monitored, which flows through an output switch, reaches a predetermined threshold value (in the present figure, when a sense voltage Vcs reaches an overcurrent detection voltage Vocp). The variable delay unit 220 measures a first time T1 from when the output switch turns on by SET=H until when the comparison signal OCP switches to the high level and delays the comparison signal OCP by a second time T2 ($=K \cdot T1^2$) proportional to the square of the first time T1 to generate an overcurrent detection signal Sc. The variable delay unit 220 includes a first timer 223 for measuring the first time T1 and a second timer 224 for generating the overcurrent detection signal Sc by delaying the comparison signal OCP by the second time T2.

10 Claims, 12 Drawing Sheets

(51) Int. Cl.
*G01R 19/165* (2006.01)
*H03K 17/687* (2006.01)

(52) U.S. Cl.
CPC ....... *H02M 3/335* (2013.01); *H02M 3/33515* (2013.01); *H03K 17/687* (2013.01)

(56) References Cited

U.S. PATENT DOCUMENTS

| | | | | |
|---|---|---|---|---|
| 2001/0019573 A1* | 9/2001 | Dougherty | ........... | H01H 1/0015 374/4 |
| 2006/0279969 A1* | 12/2006 | Leung | ............... | H02M 3/33576 363/41 |
| 2008/0309312 A1* | 12/2008 | Lin | ................... | H02M 3/33507 323/318 |
| 2014/0078792 A1* | 3/2014 | Yabuzaki | ................ | H02M 1/32 363/53 |
| 2015/0244275 A1* | 8/2015 | Hinz | ................. | H02M 3/33507 363/21.17 |
| 2015/0288166 A1* | 10/2015 | Chen | .................... | H02H 3/0935 361/94 |
| 2016/0111963 A1 | 4/2016 | Oyama | | |
| 2016/0181929 A1* | 6/2016 | Chen | ................. | H02M 3/33507 363/21.18 |
| 2016/0380542 A1* | 12/2016 | Moon | .................... | G01R 19/04 323/235 |

* cited by examiner

CURRENT SENSE CIRCUIT

TECHNICAL FIELD

The invention disclosed herein relates to a current sense circuit.

BACKGROUND ART

Patent Document 1 identified below, by the present applicant, proposes a current sense circuit capable of suppressing the input voltage dependence of an effective threshold value (i.e., fluctuation or variation of an effective threshold value ascribable to variation of an input voltage) and a control circuit for a switching converter employing such a current sense circuit.

CITATION LIST

Patent Literature

Patent Document 1: Japanese Patent Application published as No. 2016-82818

SUMMARY OF INVENTION

Technical Problem

Inconveniently, the conventional current sense circuit leaves room for further improvement in terms of its efficacy in suppressing input voltage dependence.

In view of the above-mentioned inconvenience encountered by the present inventors, an object of the invention disclosed herein is to provide a current sense circuit capable of effectively suppressing the input voltage dependence of an effective threshold value.

Solution to Problem

To achieve the above object, according to one aspect of what is disclosed herein, a current sense circuit includes: a comparator configured to turn a comparison signal from a first logic level to a second logic level when a monitoring target current passing in an output switch reaches a predetermined threshold value; and a variable retarder configured to count a first time from the turning-on of the output switch to the turning of the comparison signal to the second logic level and to generate a current sense signal by delaying the comparison signal by a second time proportional to the square of the first time. (A first configuration.)

In the current sense circuit of the first configuration described above, preferably, the variable retarder includes: a first timer configured to count the first time; and a second timer configured to generate the current sense signal by delaying the comparison signal by the second time. (A second configuration).

In the current sense circuit of the first or second configuration described above, preferably, the variable retarder includes: a first capacitor from between the two terminals of which a first charge voltage is extracted; a first charger configured, after the turning-on of the output switch, to charge the first capacitor with a first charge current with a sawtooth waveform; a first discharger configured, before the charging of the first capacitor, to discharge the first capacitor; a second capacitor from between the two terminals of which a second charge voltage is extracted; a second charger configured, after the turning of the comparison signal to the second logic level, to charge the second capacitor with a predetermined second charge current; a second discharger configured, before the charging of the second capacitor, to discharge the second capacitor; and a charge voltage comparator configured to generate the current sense signal by comparing the first and second charge voltage with each other. (A third configuration).

In the current sense circuit of the third configuration described above, preferably, the first charger includes, as a means for generating the first charge current: a voltage-to-current converter configured to convert a sawtooth-wave voltage into a sawtooth-wave current; and a current mirror configured to generate the first charge current by mirroring the sawtooth-wave current. (A fourth configuration).

According to another aspect of what is disclosed herein, a power IC includes, in a form integrated together: a current sense circuit of any of the first to fourth configurations described above; and a controller configured to control the output switch in accordance with the current sense signal. (A fifth configuration).

According to another aspect of what is disclosed herein, a switching power supply includes: a power IC of the fifth configuration described above; and an output switch controlled by the power IC. (A sixth configuration).

The switching power supply of the sixth configuration described above preferably includes a DC-DC converter configured, while electrically isolating a primary circuit system and a secondary circuit system from each other with a transformer, to generate from a direct-current input voltage supplied to the primary circuit system a direct-current output voltage to supply the direct-current output voltage to a load in the secondary circuit system. Preferably, the power IC and the output switch function as constituent elements of the DC-DC converter. (A seventh configuration).

The switching power supply of the seventh configuration described above preferably further includes a rectifier configured to generate the direct-current input voltage from an alternating-current input voltage. (An eighth configuration).

According to another aspect of what is disclosed herein, an AC adapter includes: a switching power supply of the eighth configuration described above. (A ninth configuration).

According to another aspect of what is disclosed herein, an electronic appliance includes: a switching power supply of the eighth configuration described above; and a load configured to operate by being supplied with electric power from the switching power supply. (A tenth configuration).

Advantageous Effects of Invention

According to what is disclosed herein, it is possible to provide a current sense circuit capable of effectively suppressing the input voltage dependence of an effective threshold value.

DESCRIPTION OF EMBODIMENTS

<Isolated Switching Power Supply>

Figure 1:
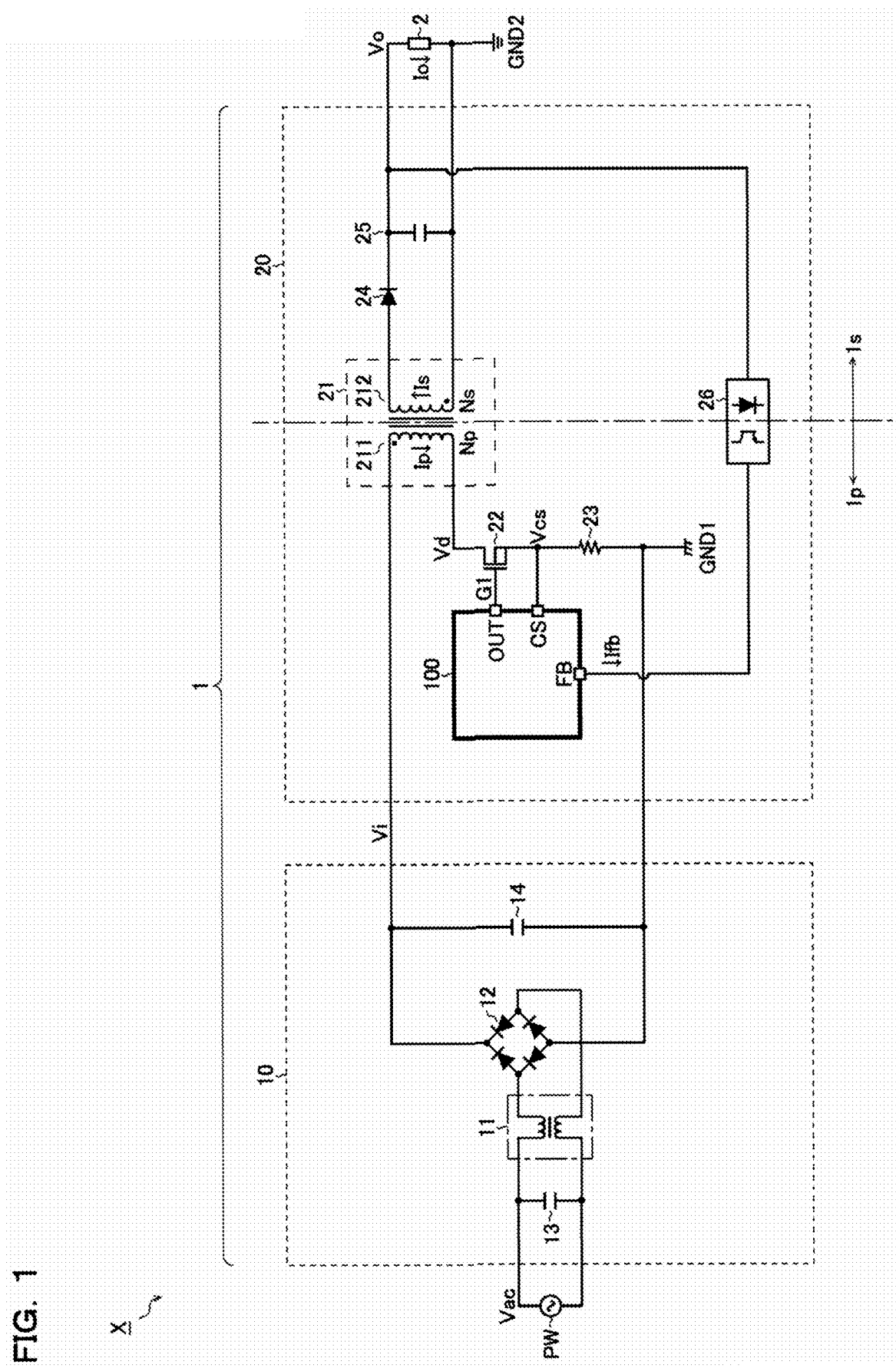
FIG. 1 is a diagram showing an overall configuration of an electronic appliance incorporating an isolated switching power supply.

FIG. 1 is a diagram showing an overall configuration of an electronic appliance incorporating an isolated switching power supply. The electronic appliance X of this configuration example includes an isolated switching power supply 1 and a load 2 that operates by being supplied with electric power from the isolated switching power supply 1.

The isolated switching power supply 1 is an AC-DC converter that, while electrically isolating between a primary circuit system 1p (GND1 system) and a secondary circuit system 1s (GND2 system), converts an alternating-current input voltage Vac (e.g., AC 85 to 265 V) fed from a commercial alternating-current power source PW to the primary circuit system 1p into a desired direct-current output voltage Vo (e.g., DC 10 to 30 V) to feed this to the load 2 in the secondary circuit system 1s. The isolated switching power supply 1 includes a rectifier 10 (i.e., AC-DC converter) and a DC-DC converter 20.

The rectifier 10 is a circuit bock that generates from the alternating-current input voltage Vac a direct-current input voltage Vi (e.g., DC 120 to 375 V) to feed this to the DC-DC converter 20. The rectifier 10 includes a filter 11, a diode bridge 12, and capacitors 13 and 14. The filter 11 eliminates noise and surges from the alternating-current input voltage Vac. The diode bridge 12 subjects the alternating-current input voltage Vac to full-wave rectification to generate the direct-current input voltage Vi. The capacitor 13 eliminates harmonic noise from the alternating-current input voltage Vac. The capacitor 14 smooths the direct-current input voltage Vi. A protective element such as a fuse can be provided in a stage preceding the rectifier 10.

The DC-DC converter 20 is a circuit block that generates from the direct-current input voltage Vi a desired direct-current output voltage Vo to supply this to the load 2. The DC-DC converter 20 includes a power IC 100 and various discrete components externally connected to it (a transformer 21, an output switch 22 (in the example shown in FIG. 1, an N-channel MOS (metal-oxide-semiconductor) field-effect transistor), a sense resistor 23, a diode 24, a capacitor 25, and an output feedback circuit 26).

The power IC 100 is a semiconductor integrated circuit device provided in the primary circuit system 1p, and is the main controlling agent in the isolated switching power supply 1 (in particular, the DC-DC converter 20). The power IC 100 is provided with, as means for establishing electrical connection with outside the device, an OUT pin, a CS pin, and an FB pin. Needless to say, the power IC 100 can be provided, as necessary, with any other external terminals (such as a VCC pin and a GND pin) other than those just mentioned.

The transformer 21 electrically isolates between the primary circuit system, 1p and the secondary circuit system 1s, and includes a primary winding 211 (with a number of turns Np) and a secondary winding 212 (with a number of turns Ns) that are magnetically coupled together.

The first terminal (winding-start terminal) of the primary winding 211 is connected to an application terminal for the direct-current input voltage Vi. The second terminal (winding-end terminal) of the primary winding 211 is connected to the drain of the output switch 22. The gate of the output switch 22 is connected to the OUT pin of the power IC 100. The source and the backgate of the output switch 22 are connected to the first terminal of the sense resistor 23 and to the CS pin of the power IC 100. The second terminal of the sense resistor 23 is connected to a ground terminal GND1 in the primary circuit system 1p. The first terminal (winding-end terminal) of the secondary winding 212 is connected to the anode of the diode 24. The cathode of the diode 24 and the first terminal of the capacitor 25 are connected to a high-potential terminal of the load 2 (i.e., an output terminal for the direct-current output voltage Vo). The second terminal (winding-start terminal) of the secondary winding 212 and the second terminal of the capacitor 25 are connected to a ground terminal GND2 in the secondary circuit system 1s.

The numbers of turns Np and Ns in the transformer 21 can be set as desired so that the desired direct-current output voltage Vo is obtained. For example, the larger the number of turns Np, or the smaller the number of turns Ns, the lower the direct-current output voltage Vo; the smaller the number of turns Np, or the larger the number of turns Ns, the higher the direct-current output voltage Vo.

The output switch 22 is a switching element that turns on and off the primary current 1p passing in the primary winding 211 by switching between a conducting and a cut-off state the current path leading from the application terminal for the direct-current input voltage Vi via the primary winding 211 to the ground terminal GND1 in accordance with a gate signal G1. The output switch 22 is on when the gate signal G1 is at high level, and is off when the gate signal G1 is at low level.

The sense resistor 23 (with a resistance value Rs) converts the primary current 1p that passes during the on-period of the output switch 22 into a sense voltage Vcs (=1p×Rs). The sense voltage Vcs is higher the higher the primary current 1p, and is lower the lower the primary current 1p.

The diode 24 and the capacitor 25 rectifies and smooths the induced voltage appearing in the secondary winding 212 of the transformer 21 to generate the direct-current output voltage Vo.

The output feedback circuit 26, while electrically isolating between the primary circuit system 1p and the secondary circuit system 1s, generates a feedback current Ifb commensurate with the direct-current output voltage Vo to feed the feedback current Ifb to the FB pin of the power IC 100. For example, the feedback current Ifb is higher the higher the direct-current output voltage Vo, and is lower the lower the direct-current output voltage Vo. The output feedback circuit 26 can be implemented by application of a well-known technology using a photocoupler or a shunt regulator, and therefore no detailed description will be given in this respect.

Of the constituent elements mentioned above, the transformer 21, the output switch 22, the diode 24, and the capacitor 25 function as a step-down (bucking) switching output stage of a flyback type that generates from the direct-current input voltage Vi the direct-current output voltage Vo.

The bucking operation of the just-mentioned switching output stage will be described briefly. During the on-period of the output switch 22, the primary current 1p passes from the application terminal for the direct-current input voltage Vi via the primary winding 211, the output switch 22, and the sense resistor 23 toward the ground terminal GND1. Thus, electric energy is stored in the primary winding 211.

Thereafter, when the output switch 22 is turned off, an induced voltage appears in the secondary winding 212, which is magnetically coupled with the primary winding 211, and a secondary current 1s passes from the secondary winding 212 via the diode 24 and the capacitor 25 toward the ground terminal GND2. Meanwhile, a direct-current output voltage Vo resulting from the induced voltage in the secondary winding 212 being rectified and smoothed is supplied to the direct-current output voltage Vo.

Thereafter, the output switch 22 is turned on and off so that switching output operation similar to that described above repeats.

As described above, with the isolated switching power supply 1 of this configuration example, it is possible, while electrically isolating between the primary circuit system 1p and the secondary circuit system 1s, to generate from an alternating-current input voltage Vac a direct-current output voltage Vo to supply this to the load While FIG. 1 shows, as an example, a step-down switching output stage of a flyback type, the output stage of the DC-DC converter 20 can instead be configured as a forward type or be implemented with a buck converter or boost converter.

<Power IC>

Figure 2:
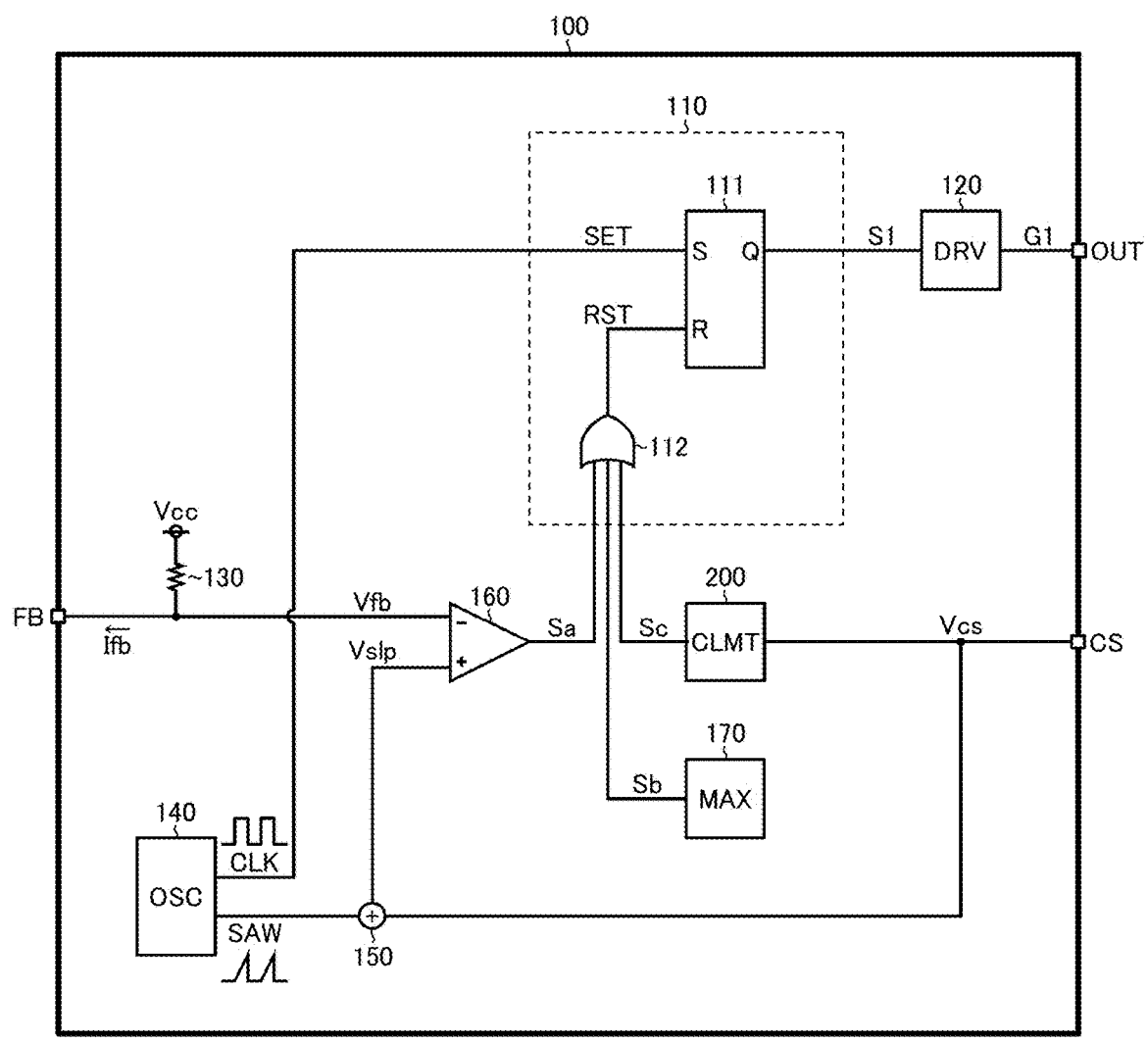
FIG. 2 is a diagram showing one configuration example of a power IC.

FIG. 2 is a diagram showing one configuration example of the power IC 100. The power IC 100 of this configuration example is formed by integrating together a controller 110, a driver 120, a resistor 130, an oscillator 140, an adder 150, a comparator 160, a maximum duty setter 170, and a current limiter 200. Needless to say, the power IC 100 can further have integrated into it, as necessary, any other constituent elements other than those enumerated just above (such as a soft-starting circuit, a reference voltage source, an overvoltage protection circuit, and an undervoltage protection circuit).

The controller 110 is a logic circuit that receives a clock signal CLK, a pulse-width modulation signal Sa, a maximum duty setting signal Sb, and an overcurrent detection signal Sc to generate a switching control signal S1. The controller 110 includes an RS flip-flop 111 and an OR gate 112.

In accordance with a set signal SET (i.e., the clock signal CLK), which is fed to the set terminal (S) of the RS flip-flop 111, and a reset signal RST, which is fed to the reset terminal (R) of the RS flip-flop 111, the RS flip-flop 111 outputs, from its output terminal (Q), the switching control signal S1. More specifically, in response to a rising edge in the set signal SET, the RS flip-flop 111 sets the switching control signal S1 to high level; in response to a rising edge in the reset signal RST, the RS flip-flop 111 resets the switching control signal S1 to low level.

The OR gate 112 subjects the pulse-width modulation signal Sa, the maximum duty setting signal Sb, and the overcurrent detection signal Sc to logical addition operation (OR operation), and thereby generates the reset signal RST. Accordingly, the reset signal RST is at high level when at least one of the three signals Sa to Sc mentioned above is at high level, and is at low level when those signals are all at low level.

The driver 120 generates the gate signal G1 in accordance with the switching control signal S1, and feeds the gate signal G1 to the OUT pin.

The resistor 130 (with a resistance value R130) is connected between an application terminal for a supply voltage Vcc and the FB pin, and converts the feedback current Ifb into a feedback voltage Vfb (=Vcc−Ifb×R130). The feedback voltage Vfb is lower the higher the feedback current Ifb, and is higher the lower the feedback current Ifb. That is, the feedback voltage Vfb is lower the higher the direct-current output voltage Vo, and is higher the lower the direct-current output voltage Vo.

The oscillator 140 generates the clock signal CLK (i.e., the set signal SET) with a rectangular waveform at a predetermined switching frequency Fsw. The oscillator 140 also generates, separately, a sawtooth-wave voltage SAW with a sawtooth waveform in synchronism with the just-mentioned clock signal CLK.

The adder 150 adds up the sense voltage Vcs, which is fed to the CS pin, and the sawtooth-wave voltage SAW to generate a slope voltage Vslp. In an application that does not require a slope compensation function using the sense voltage Vcs, the adder 150 can be omitted.

The comparator 160 generates the pulse-width modulation signal Sa by comparing the feedback voltage Vfb, which is fed to the inverting input terminal (−) of the comparator 160, with the slope voltage Vslp, which is fed to the non-inverting input terminal (+) of the comparator 160. Accordingly, the pulse-width modulation signal Sa is at low level when the slope voltage Vslp is lower than the feedback voltage Vfb, and is at high level when the slope voltage Vslp is higher than the feedback voltage Vfb.

The maximum duty setter 170 produces a one-shot pulse in the maximum duty setting signal Sb when, after the clock signal CLK (i.e., the set signal SET) is raised to high level, a predetermined maximum duty setting period (e.g., corresponding to the on-duty Don=90 to 95%) has elapsed. The on-duty Don here is the proportion (=Ton/T) of the on-period Ton of the output switch 22 in the switching period T (=1/Fsw).

The current limiter 200 is fed with the sense voltage Vcs, which is fed to the CS pin, to generate the overcurrent detection signal Sc. The overcurrent detection signal Sc is at high level when an overcurrent is being detected, and is at low level when no overcurrent is being detected.

<Current Limiter>

Figure 3:
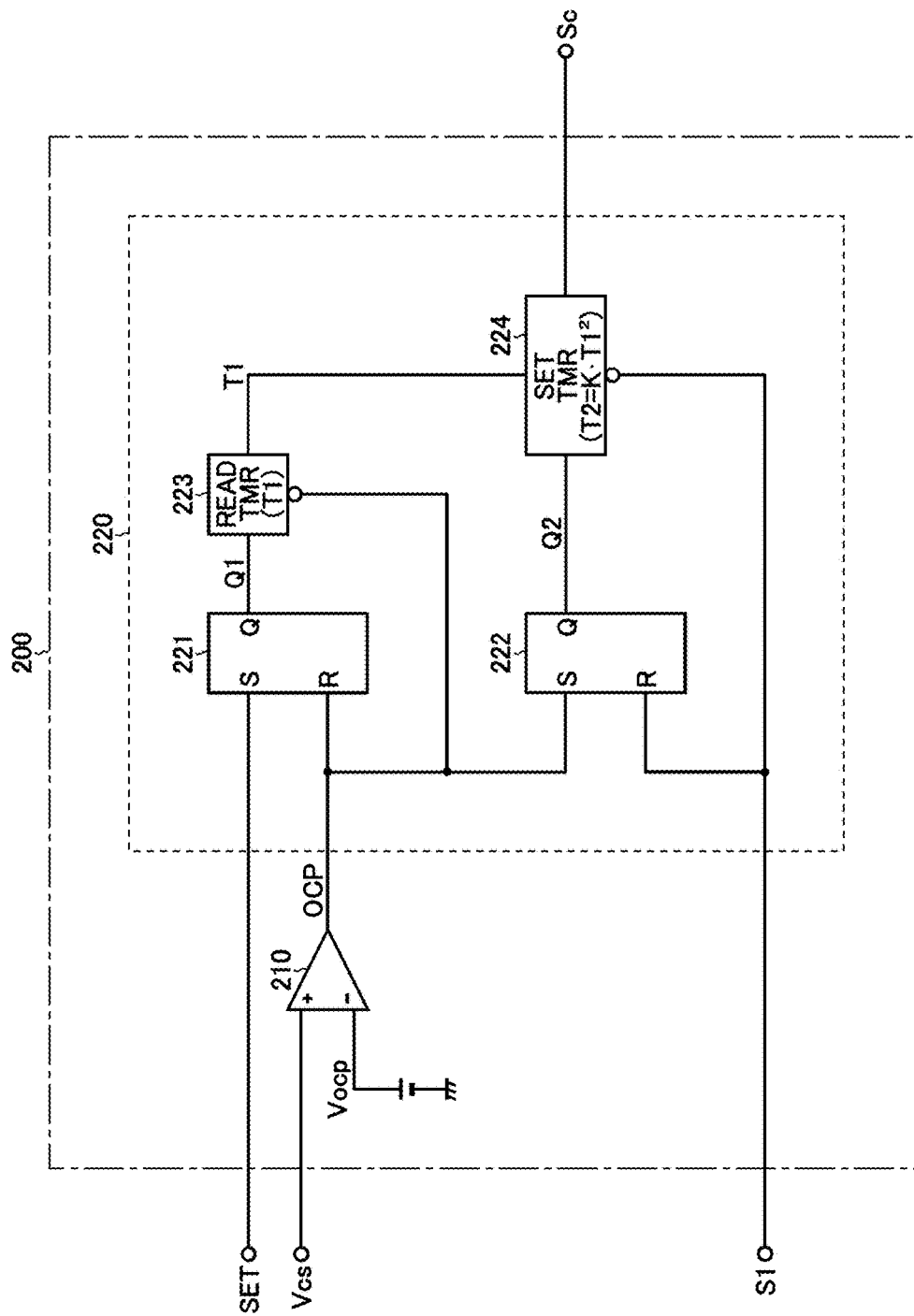
FIG. 3 is a diagram showing a current limiter according to a first practical example.

FIG. 3 is a diagram showing the current limiter 200 according to a first practical example The current limiter 200 of this practical example is a circuit portion that corresponds to one example of a current detection circuit, and includes a comparator 210 and a variable retarder 220.

The comparator 210 generates a comparison signal OCP by comparing the sense voltage Vcs, which is fed to the non-inverting input terminal (±) of the comparator 210, with a threshold voltage Vocp, which is fed to the inverting input terminal (−) of the comparator 210. Accordingly, the comparison signal OCP is at high level when the sense voltage Vcs is higher than the threshold voltage Vocp, and is at low level when the sense voltage Vcs is lower than the threshold voltage Vocp. That is, when the primary current 1p (corresponding to a monitoring target current) that passes in the output switch 22 reaches a predetermined threshold value, the comparator 210 turns the comparison signal OCP from low level to high level.

The variable retarder 220 is a circuit portion that delays the comparison signal OCP to generate the overcurrent detection signal Sc, and includes RS flip-flops 221 and 222 and timers 223 and 224.

In accordance with the set signal SET, which is fed to the set terminal (S) of the RS flip-flop 221, and the comparison signal OCP, which is fed to the reset terminal (R) of the RS flip-flop 221, the RS flip-flop 221 outputs, from its output terminal (Q), an output signal Q1. More, specifically, in response to a rising edge in the set signal SET, the RS flip-flop 221 sets the output signal QI to high level; in response to a rising edge in the comparison signal OCP, the RS flip-flop 221 resets the output signal Q1 to low level.

In accordance with the comparison signal OCP, which is fed to the set terminal (S) of the RS flip-flop 222, and the switching control signal S1, which is fed to the reset terminal (R) of the RS flip-flop 222, the RS flip-flop 222 outputs, from its output terminal (Q), an output signal Q2. More, specifically, in response to a rising edge in the comparison signal OCP, the RS flip-flop 222 sets the output signal Q2 to high level; in response to a rising edge in the switching control signal S1, the RS flip-flop 222 resets the output signal Q2 to low level.

The timer 223 (corresponding to a read timer) starts counting in response to a rising edge in the output signal Q1, and stops counting in response to a rising edge in the comparison signal OCP. Thus, the timer 223 counts a first time T1 from the turning on of the output switch 22 to the turning of the comparison signal OCP to high level.

The timer 224 (corresponding to a delay setting timer) starts counting in response to a rising edge in the output signal Q2, and delays the comparison signal OCP by a second time T2 (=K·T1$^2$), which is proportional to the square of the first time T1, thereby to generate the overcurrent detection signal Sc. The count value of the timer 224 is reset in response to a rising edge in the switching control signal S1.

Figure 4:
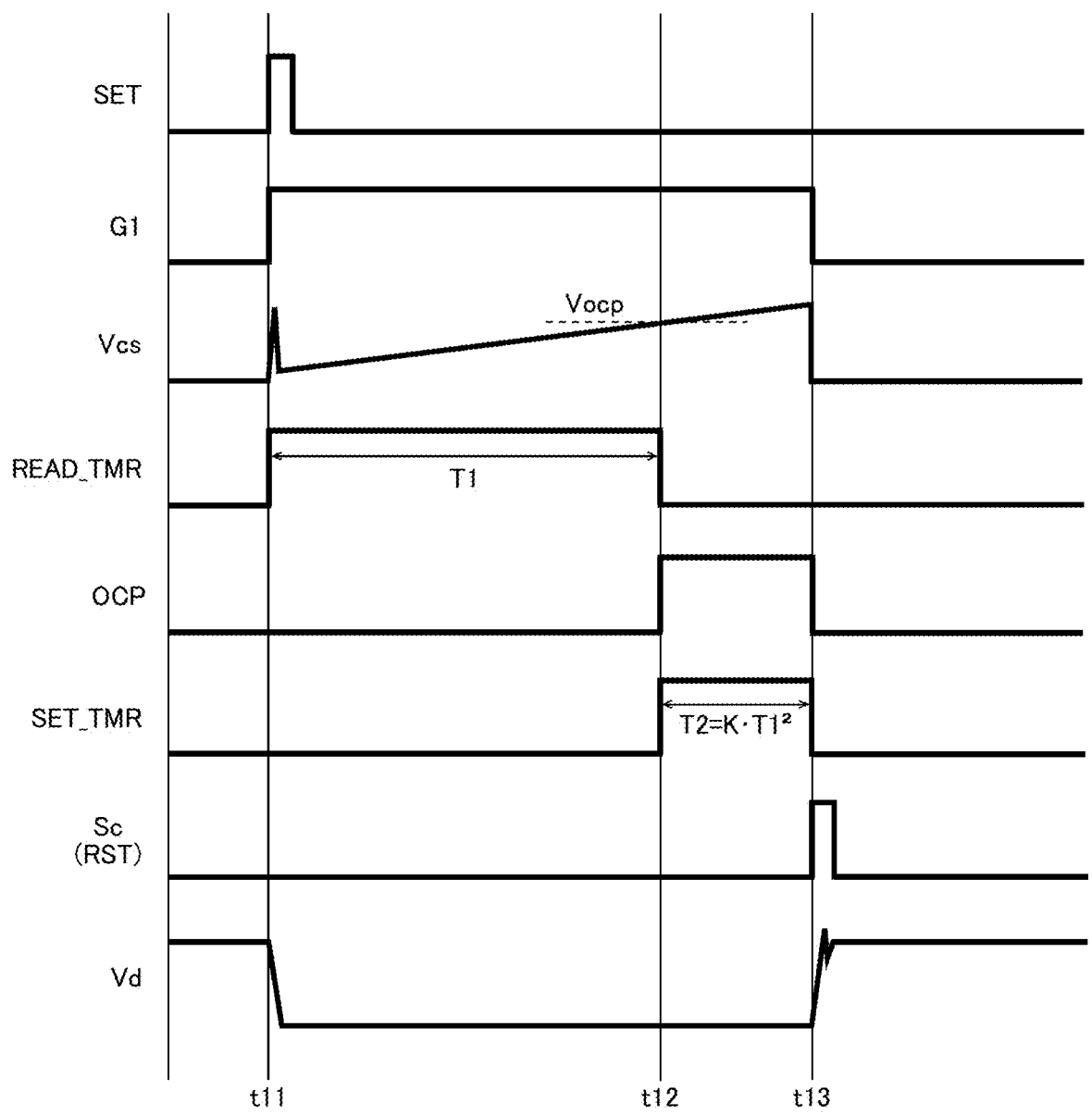
FIG. 4 is a timing chart showing current limiting operation in the first practical example.

FIG. 4 is a timing chart showing one example of current limiting operation by the current limiter 200 according to the first practical example, depicting, from top down, the set signal SET, the gate signal G1, the sense voltage Vcs, the count period (READ_TMR) of the timer 223, the comparison signal OCP, the count period (SET_TMR) of the timer 224, the overcurrent detection signal Sc (corresponding to the reset signal RST), and the drain voltage Vd of the output switch 22.

When, at time point 61, the set signal SET rises to high level, the gate signal G1 turns to high level; thus, the output switch 22 turns on. As a result, the primary current 1p passes in the output switch 22, and thus the sense voltage Vcs starts to rise. At this point, however, the sense voltage Vcs is lower than the threshold voltage Vocp, and thus the comparison signal OCP is kept at low level. Meanwhile, as a result of the output switch 22 turning on, the drain voltage Vd of the output switch 22 falls from high level ($\approx$Vi) down to low level Vcs). In the timer 223, in response to a rising edge in the set signal SET (and hence a rising edge in the output signal Q1), the counting of the first time TI is started. On the other hand, in the timer 224, until a rising edge in the comparison signal OCP (and hence a rising edge in the output signal Q2), the counting of the second time T2 is suspended. Accordingly, the overcurrent detection signal Sc, too, is kept at low level.

When, at time point t12, the sense voltage Vcs becomes higher than the threshold voltage Vocp, the comparison signal OCP rises to high level. As a result, while the counting of the first time Tl by the timer 223 is stopped, the counting of the second time T2 by the timer 224 is started. As mentioned previously, the second time T2 is set at a length (=K·T1$^2$) proportional to the square of the first time T1 counted by the timer 223.

Thereafter, when, at time point t13, the counting of the second time T2 is complete, the timer 224 raises the overcurrent detection signal Sc to high level. As a result, the reset signal RST rises to high level, and the gate signal G1 falls to low level; thus, the output switch 22 is turned off forcibly. Accordingly, the primary current 1p is cut off; thus, the sense voltage Vcs falls to a zero value, and the comparison signal OCP falls to low level. Meanwhile, as a result of the output switch 22 turning off, the drain voltage Vd of the output switch 22 rises from low level ($\approx$Vcs) up to high level ($\approx$Vi).

The current limiter 200 operates basically as described above. To follow is a detailed discussion of the technical significance of introducing the variable retarder 220 into the current limiter 200.

FIG. 4, referred to previously, shows how, after the overcurrent detection signal Sc is raised to high level at time point t13, the gate signal G1 is dropped to low level without delay. In reality, however, a delay time Td occurs due to an internal delay in the power IC 100 and the switching time of the output switch 22 (chiefly the charging time of the parasitic gate capacitance) (see time points t23 to t24 and t27 to t28 in FIG. 5, which will be referred to later).

First, consider, as a comparative example, a configuration without the variable retarder 220 introduced. In this case, the maximum input power Pin to the isolated switching power supply 1 on detection of an overcurrent is given by formula (1) below. In the formula, Lp represents the inductance value of the primary winding 211.

[Formula 1]

$$\text{Pin} = \frac{1}{2} \cdot Lp \cdot Ip^2 \cdot Fsw \qquad (1)$$
$$= \frac{1}{2} \cdot Lp \cdot \left(\frac{Vocp}{Rs} + \frac{Vi}{Lp} \cdot Td\right)^2 \cdot Fsw$$

Here, if Td=0, the term (Vi/Lp)·Td always equals zero; this makes it possible to determine the maximum input power Pin univocally in accordance with the threshold voltage Vocp.

In reality, however, Td$\neq$0, and thus the term (Vi/Lp)·Td varies with the direct-current input voltage Vi. Accordingly, as the peak value of the alternating-current input voltage Vac rises, the higher the direct-current input voltage Vi, the further the value of the maximum input power Pin is greater than its supposed value.

That is, without the variable retarder 220 introduced, the effective threshold voltage Vocp_eff (>Vocp) varies because of its dependence on the input voltage, and this makes it inevitable to set the threshold voltage Vocp slightly lower than it should be.

Next, consider a configuration with the current limiter 200 introduced. In this case, the maximum input power Pin to the isolated switching power supply 1 on detection of an overcurrent is given by formula (2) below.

[Formula 2]

$$\begin{aligned} Pin &= \frac{1}{2} \cdot Lp \cdot Ip^2 \cdot Fsw \\ &= \frac{1}{2} \cdot Lp \cdot \left( \frac{Vocp}{Rs} + \frac{Vi}{Lp} \cdot T2 + \frac{Vi}{Lp} \cdot Td \right)^2 \cdot Fsw \\ &= \frac{1}{2} \cdot Lp \cdot \left( \frac{Vocp}{Rs} + \frac{Vi}{Lp} \cdot K \cdot T1^2 + \frac{Vi}{Lp} \cdot Td \right)^2 \cdot Fsw \end{aligned} \quad (2)$$

Here, the first time T1 is given by formula (3) below.

[Formula 3]

$$T1 = \frac{Vocp}{Rs} \cdot \frac{Lp}{Vi} \quad (3)$$

Thus, with formula (3) substituted in formula (2) noted previously, the maximum input power Pin is now given by formula (4) below.

[Formula 4]

$$\begin{aligned} Pin &= \frac{1}{2} \cdot Lp \cdot \left( \frac{Vocp}{Rs} + \frac{Vi}{Lp} \cdot K \cdot T1^2 + \frac{Vi}{Lp} \cdot Td \right)^2 \cdot Fsw \\ &= \frac{1}{2} \cdot Lp \cdot \left( \frac{Vocp}{Rs} + \frac{Vi}{Lp} \cdot K \cdot \left( \frac{Vocp}{Rs} \cdot \frac{Lp}{Vi} \right)^2 + \frac{Vi}{Lp} \cdot Td \right)^2 \cdot Fsw \\ &= \frac{1}{2} \cdot Lp \cdot \left( \frac{Vocp}{Rs} + K \cdot \left( \frac{Vocp}{Rs} \right)^2 \cdot \frac{Lp}{Vi} + \frac{Vi}{Lp} \cdot Td \right)^2 \cdot Fsw \end{aligned} \quad (4)$$

As will be understood from formula (4) above, of the three current components (i.e., the three terms inside the parentheses in the right side) contained in the primary current 1p, the current component ascribable to the introduction of the variable retarder 220 (i.e., the second term) is inversely proportional to the direct-current input voltage Vi, and the current component ascribable to the delay time Td (i.e., the third term) is proportional to the direct-current input voltage Vi.

Accordingly, when as the direct-current input voltage Vi varies one of the just-mentioned two current components increases, the other decreases. That is, the two current components cancel each other, and this makes the upper-limit value of the primary current 1p that passes on detection of an overcurrent less prone to vary.

It is preferable that the coefficient K be set such that, when the direct-current input voltage Vi has a predetermined value (e.g., the center value of the voltage variation width), the above-mentioned current components (the second and third terms) are equal.

Figure 5:
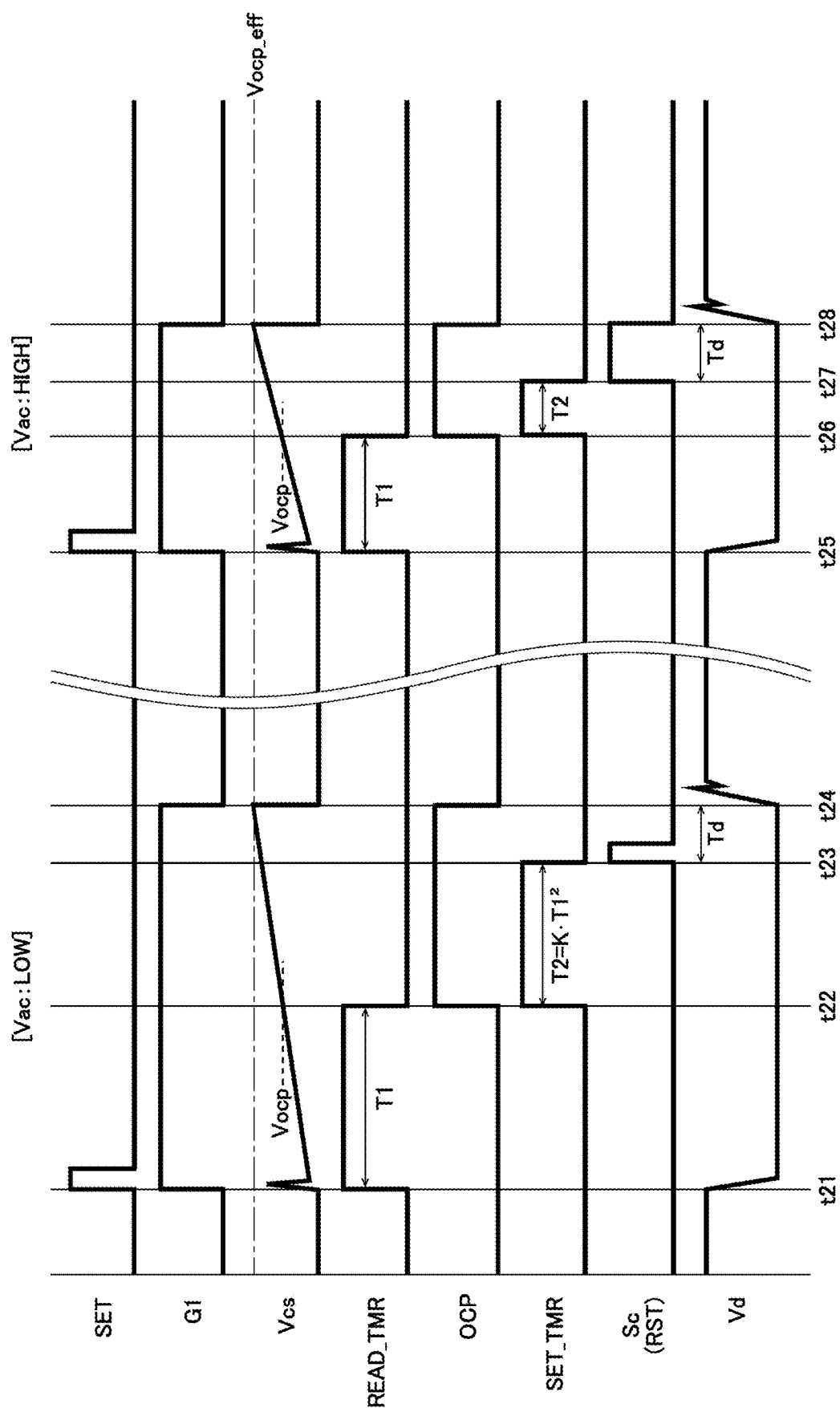
FIG. 5 is a timing chart showing how the input voltage dependence of an effective threshold value is suppressed.

FIG. 5 is a timing chart showing how the input voltage dependence of the effective threshold voltage Vocp_eff in the current limiter 200 is suppressed, and like FIG. 4 referred to previously depicts, from top down, the set signal SET, the gate signal G1, the sense voltage Vcs, the operating status (READ_TMR) of the timer 223, the comparison signal OCP, the operating status (SET_TMR) of the timer 224, the overcurrent detection signal Sc (corresponding to the reset signal RST), and the drain voltage Vd of the output switch 22.

The left part (time points t21 to t24) of FIG. 5 shows the operation observed when the direct-current input voltage Vi is comparatively low, and the right part (time points t25 to t28) of FIG. 5 shows the operation observed when the direct-current input voltage Vi is comparatively high. The operation in either condition is basically the same as that shown in FIG. 4 referred to previously.

As shown in the left part of FIG. 4, when the direct-current input voltage Vi is comparatively low, the sense voltage Vcs has a gentle gradient, and the gate signal G1, exhibits a wide on-width. In this condition, the first time T1 is long, and the second time T2 is accordingly long.

On the other hand, as shown in the right part of FIG. 4, when the direct-current input voltage Vi is comparatively high, the sense voltage Vcs has a steep gradient, and the gate signal G1 exhibits a narrow on-width. In this condition, the first time T1 is short, and the second time T2 is accordingly short.

The variable retardation operation described above makes the upper-limit value of the primary current 1p that passes on detection of an overcurrent less prone to vary; thus, the maximum input power Pin to the isolated switching power supply 1 is kept constant. In this way, with the current limiter 200 of this practical example, it is possible to effectively suppress the input voltage dependence of the effective threshold voltage Vocp_eff with the variable retarder 220.

In addition, as opposed to the conventional technology in which the sense voltage Vcs (or the threshold voltage Vocp) is given an offset in accordance with the direct-current current input voltage Vi, even a drop in the direct-current input voltage Vi does not lead to inconveniences such as chattering in the comparison signal OCP. This permits more accurate detection of an overcurrent.

Thus, in the present invention, the first time T1 from the turning-on of the output switch 22 to the turning of the comparison signal OCP to high level is counted, and the comparison signal OCP is delayed for the second time T2 commensurate with the first time T1 to generate the overcurrent detection signal Sc. When these features are seen apart from the rest, the present invention is similar to the prior art disclosed in Patent Document 1 by the present applicant.

However, whereas, according to Patent Document 1, the second time T2 is proportional to the first time Ti, in the present invention, the second time T2 is proportional to the "square" of the first time T1. In this respect, the two technologies are distinct from each other. This is because, in the present invention, it is exactly owing to the delay setting such that $T2=K \cdot T1^2$ that formula (4) noted previously holds and hence the current component ascribable to the introduction of the variable retarder 220 and the current component ascribable to the delay time Td cancel each other. Thus, the present invention could not be attained by simply applying a design change to the conventional technology disclosed in Patent Document 1.

Figure 6:
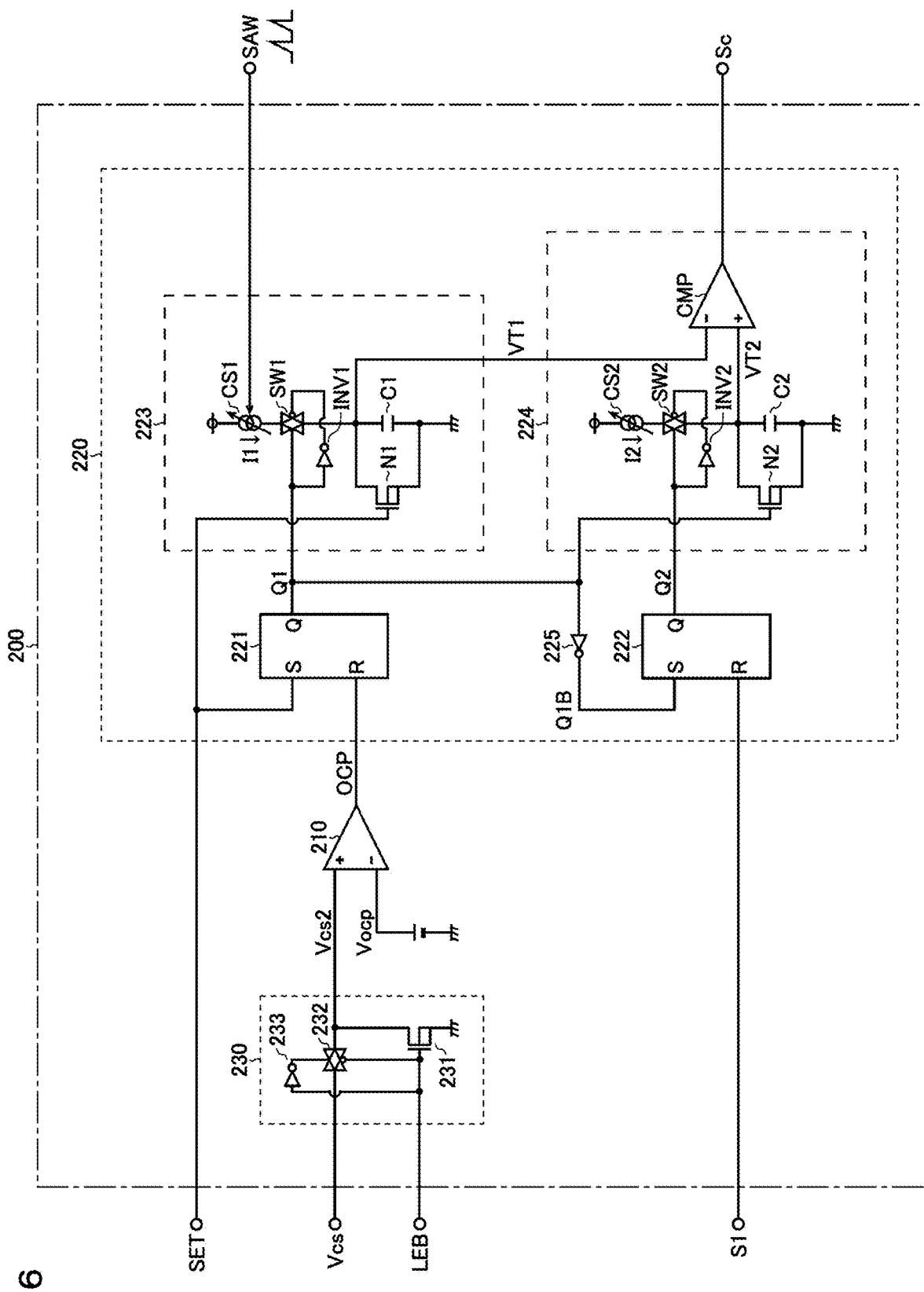
FIG. 6 is a diagram showing a current limiter according to a second practical example.

FIG. 6 is a diagram showing the current limiter 200 according to a second practical example. The current limiter 200 of this practical example is based on the first practical example (FIG. 3) described previously but is modified in a few respects, such as substantiation of the timers 223 and 224 and addition of a masking processor 230. Accordingly, such constituent elements as find counterparts in the first practical example will be identified by the same reference signs as those in FIG. 3, and no overlapping description will be repeated. The following description focuses on features unique to the second practical example.

First, the masking processor 230 added in this practical example will be described.

The masking processor 230 is a circuit portion that applies predetermined masking to the sense voltage Vcs to generate a second sense voltage Vcs2 and that feeds this to the non-inverting input terminal (+) of the comparator 210. The masking processor 230 includes an N-channel MOS field-effect transistor 231, a switch 232, and an inverter 233.

The drain of the transistor 231 and the first terminal of the switch 232 are connected to the non-inverting input terminal (+) of the comparator 210. The second terminal of the switch 232 is connected to an input terminal for the sense voltage Vcs. The source and the backgate of the transistor 231 are connected to a ground terminal. The gate of the transistor 231, the inverting control terminal of the switch 232, and the input terminal of the inverter 233 are connected to an input terminal for a mask signal LEB (short for "leading edge blocking"). The output terminal of the inverter 233 is connected to the control terminal of the switch 232.

In the masking processor 230 configured as described above, the transistor 231 is on when the mask signal LEB is at high level, and is off when the mask signal LEB is at low level. On the other hand, the switch 232 is off when the mask signal LEB is at high level, and is on when the mask signal LEB is at low level. In this way, the transistor 231 and the switch 232 are turned on and off complementary in accordance with the mask signal LEB.

Accordingly, in the masking processor 230, after the output switch 22 is turned on, for a predetermined masking period (i.e., the high-level period of the mask signal LEB), the second sense voltage Vcs2 is held at zero value. With this configuration, it is possible to mask the ringing noise in the sense voltage Vcs that occurs when the output switch 22 turns on, and thus to achieve stabler switching control and stabler overcurrent detection.

Next, the variable retarder 220 will be described. In the current limiter 200 of this practical example, the set terminal (S) of the RS flip-flop 222 is fed with not the comparison signal OCP but an inverted output signal Q1B (which is the logically inverted signal, generated with an inverter 225, of the output signal Q1). Accordingly, the RS flip-flop 222 sets the output signal Q2 to high level in response to a rising edge in the inverted output signal Q1B, and resets the output signal Q2 to low level in response to a rising edge in the switching control signal S1.

Moreover, in the current limiter 200 of this practical example, the timers 223 and 224 are implemented as analog timer circuits. This will be described specifically below in terms of what is shown in FIG. 6.

The timer 223 includes a current source CS1, a switch SW1, an inverter INV1, a capacitor C1, and an N-channel MOS field-effect transistor N1.

The first terminal of the current source CS1 is connected to a supply power terminal The second terminal of the current source CS1 is connected to the first terminal of the switch SW1. The control terminal of the current source CS1 is connected to an input terminal for a sawtooth-wave voltage SAW. The second terminal of the switch SW1 is connected to the first terminal of the capacitor C1. The second terminal of the capacitor C1 is connected to a ground terminal. The control terminal of the switch SW1 and the input terminal of the inverter INV1 are both connected to the output terminal (Q) of the RS flip-flop 221. The output terminal of the inverter INV1 is connected to the inverting control terminal of the switch SW1. The drain of the transistor N1 is connected to the first terminal of the capacitor C1. The source and the backgate of the transistor N1 are connected to the second terminal of the capacitor C1. The gate of the transistor N1 is connected to an input terminal for the set signal SET.

In the timer 223 configured as described above, the capacitor C 1 functions as a first capacitor from between the two terminals of which a charge voltage VT1 is extracted.

The current source CS1 generates a charge current I1 with a sawtooth waveform in accordance with the sawtooth-wave voltage SAW, which is fed to the control terminal of the current source CS1. The switch SW1 is on when the output signal Q1 is at high level, and is off when the output signal Q1 is at low level. Accordingly, the current source CS1 and the switch SW1 function as a first charger that, starting when the output switch 22 turns on, charges the capacitor C1 with the charge current I1 with a sawtooth waveform.

The transistor N1 is on when the set signal SET is at high level, and is off when the set signal SET is at low level. Accordingly, the transistor N1 functions as a first discharger that, before the charging of the capacitor Cl, discharges the capacitor C1 by short-circuiting between the two terminals of the capacitor C1.

On the other hand, the timer 224 includes a current source CS2, a switch SW2, an inverter INV2, a capacitor C2, an N-channel MOS field-effect transistor N2, and a comparator CMP.

The first terminal of the current source CS2 is connected to a supply power terminal. The second terminal of the current source CS2 is connected to the first terminal of the switch SW2. The second terminal of the switch SW2 is connected to the first terminal of the capacitor C2. The second terminal of the capacitor C2 is connected to a ground terminal. The control terminal of the switch SW2 and the input terminal of the inverter INV2 are both connected to the output terminal (Q) of the RS flip-flop 222. The output terminal of the inverter INV2 is connected to the inverting control terminal of the switch SW2. The drain of the transistor N2 is connected to the first terminal of the capacitor C2. The source and the backgate of the transistor N2 are connected to the second terminal of the capacitor C2. The gate of the transistor N2 is connected to the output terminal (Q) of the RS Clip-flop 221. The inverting input terminal (−) of the comparator CMP is connected to the first terminal of the capacitor C1. The non-inverting input terminal (+) of the comparator CMP is connected to the first terminal of the capacitor C2. The output terminal of the comparator CMP is connected to an output terminal for the overcurrent detection signal Sc.

In the timer 224 configured as described above, the capacitor C2 functions as a second capacitor from between the two terminals of which a charge voltage VT2 is extracted.

The current source CS2 generates a predetermined charge current I2. The switch SW2 is on when the output signal Q2 is at high level, and is off when the output signal Q2 is at low level. Accordingly, the current source CS2 and the switch SW2 function as a second charger that, starting when the comparison signal OCP turns to high level, charges the capacitor C2 with the predetermined charge current I2.

The transistor N2 is on when the output signal Q1 is at high level, and is off when the output signal Q1 is at low level. Accordingly, the transistor N2 function as a second discharger that, before the charging of the capacitor C2, discharges the capacitor C2 by short-circuiting between the two terminals of the capacitor C2.

The comparator CMP functions as a charge voltage comparator that compares the charge voltages VT1 and VT2 with each other to generate the overcurrent detection signal Sc. The overcurrent detection signal Sc is at low level when the charge voltage VT2 is lower than the charge voltage VT1, and is at high level when the charge voltage VT2 is higher than the charge voltage VT1.

Figure 7:
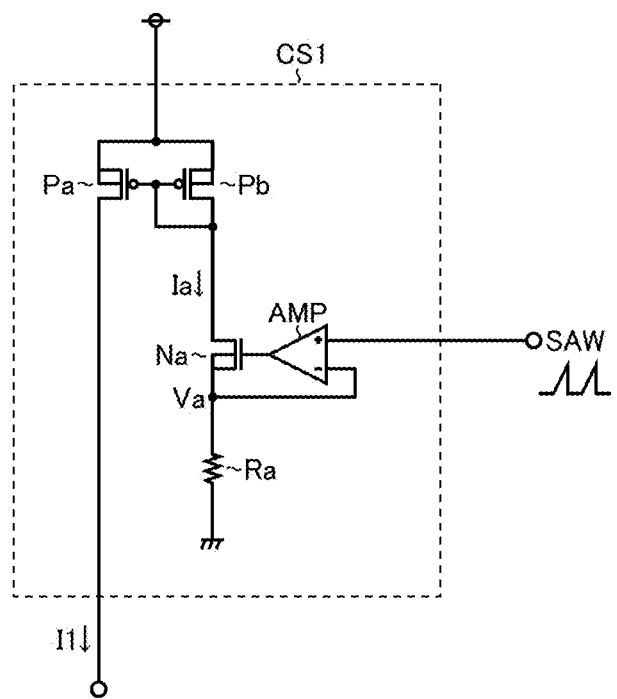
FIG. 7 is a diagram showing one configuration example of a current source.

FIG. 7 is a diagram showing one configuration example of the current source CS1. The current source CSI of this configuration example includes P-channel MOS field-effect transistors Pa and Pb, an N-channel MOS field-effect transistor Na, a resistor Ra, and an operational amplifier AMP.

The sources and the backgates of the transistors Pa and Pb are all connected to a supply power terminal. The gates of the transistors Pa and Pb are both connected to the drain of the transistors Pb. The drain of the transistors Pa corresponds to an output terminal for the charge current Ii. The drain of the transistors Pb is connected to the drain of the transistor Na. The source and the backgate of the transistor Na are connected to the first terminal of the resistor Ra. The second terminal of the resistor Ra is connected to a ground terminal. The gate of the transistor Na is connected to the output terminal of the operational amplifier AMP. The non-inverting input terminal (+) of the operational amplifier AMP is connected to an input terminal for the sawtooth-wave voltage SAW. The inverting input terminal (−) of the operational amplifier AMP is connected to the first terminal of the resistor Ra.

In the current source CSI configured as described above, the operational amplifier AMP controls the gate voltage of the transistor Na so that the non-inverting input terminal (+) and the inverting input terminal (−) of the operational amplifier AMP are imaginarily short-circuited together. Accordingly, the resistor Ra is fed with a node voltage Va that is equivalent to the sawtooth-wave voltage SAW, and in accordance with it, a sawtooth-wave current Ia (=Va/Ra=SAW/Ra) passes in the resistor Ra. That is, the transistor N1, the resistor Ra, and the operational amplifier AMP function as a voltage-to-current converter that converts the sawtooth-wave voltage SAW into the sawtooth-wave current Ia.

The transistors Pa and Pb function as a current mirror that mirrors the sawtooth-wave current Ia by a predetermined mirroring factor a to generate the charge current (=α·Ia).

Figure 8:
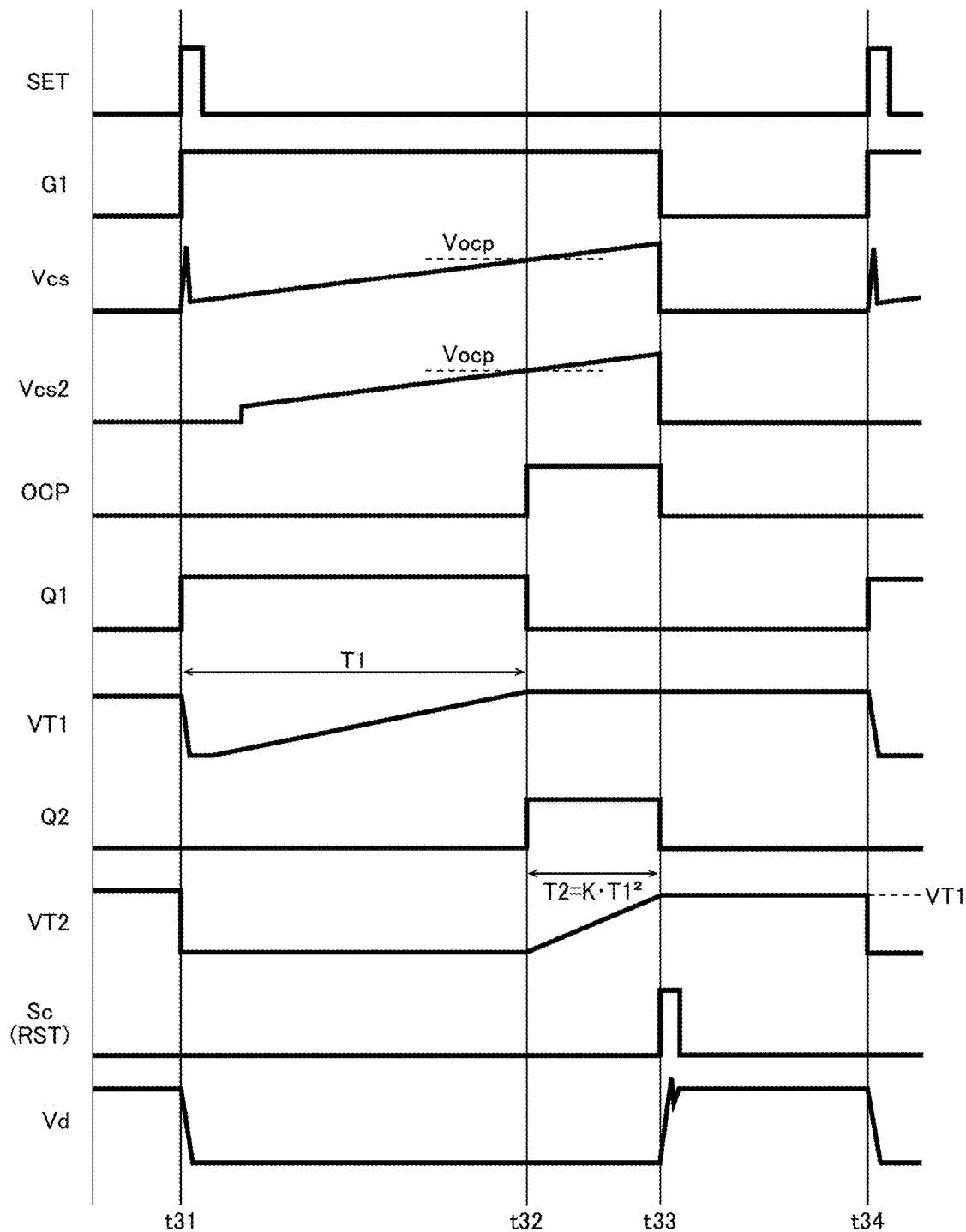
FIG. 8 is a timing chart showing current limiting operation in the second practical example.

FIG. 8 is a timing chart showing one example of current limiting operation by the current limiter 200 according to the second practical example, depicting, from top down, the set signal SET, the gate signal G1, the sense voltage Vcs, the second sense voltage Vcs2, the comparison signal OCP, the output signal Q1, the charge voltage VT1, the output signal Q2, the charge voltage VT2, the overcurrent detection signal Sc (corresponding to the reset signal RST), and the drain voltage Vd of the output switch 22.

When, at time point t31, the set signal SET rises to high level, the gate signal G1 turns to high level; thus, the output switch 22 turns on. As a result, the primary current 1p starts to flow in the output switch 22, and thus the sense voltage Vcs starts to rise. At this point, however, the sense voltage Vcs is lower than the threshold voltage Vocp, and thus the comparison signal OCP is kept at low level. Meanwhile, starting when the output switch 22 turns on, for a predetermined masking period, the second sense voltage Vcs2 is held at a zero value. This prevents erroneous detection of an overcurrent under the influence of ringing noise. On the other hand, as a result of the output switch 22 turning on, the drain voltage Vd of the output switch 22 falls from high level (≈Vi) to low level (≈Vcs).

In the timer 223, during the high-level period of the set signal SET, the capacitor C1 is discharged, and then, in response to a rising edge in the output signal Q1, the capacitor C1 starts to be charged. Accordingly, the charge voltage VT1 first falls to a zero value and then starts rising with a predetermined gradient. The charging of the capacitor C1 here corresponds to the counting of the first time T1.

On the other hand, in the timer 224, in response to the output signal Q1 being raised to high level, the capacitor C2 is discharged, and thus the charge voltage VT2 falls to a zero value. Even then, until a rising edge in the inverted output signal Q1B (a falling edge in the output signal Q1), the charging of the capacitor C2 (corresponding to the counting of the second time T2) is suspended. Accordingly, the overcurrent detection signal Sc continues to be kept at low level.

When, at time point t32, the second sense voltage Vcs2 becomes higher than the threshold voltage Vocp, the comparison signal OCP rises to high level. As a result, the output signal Q1 is reset to low level, and thus, in the timer 223, the charging of the capacitor C1 (i.e., the counting of the first time T1) is stopped. On the other hand, in the timer 224, in response to a rising edge in the inverted output signal Q1B (that is, a falling edge in the output signal Q1), the output signal Q2 is set to high level. As a result, the charging of the capacitor C2 is started, and the charge voltage VT2 starts to rise. The charging of the capacitor C2 here corresponds to the counting of the second time T2.

Thereafter, when, at time point t33, the charge voltage VT2 reaches the charge voltage VTI, the overcurrent detection signal Sc is raised to high level. As a result, the reset signal RST rises to high level, and the gate signal G1 falls to low level; thus, the output switch 22 is turned off forcibly. Accordingly, the primary current 1p is cut off; thus, the sense voltage Vcs falls to a zero value, and the comparison signal OCP falls to low level. Meanwhile, as a result of the output switch 22 turning off, the drain voltage Vd of the output switch 22 rises from low level (≈Vcs) up to high level Vi).

When, at time point t34, the set signal SET is raised back to high level, a self recovery from an overcurrent protection state (i.e., the state where the output switch 22 is forcibly kept off) takes place, and then operation similar to that described above repeats.

Next, with attention paid to each of the charge voltages VT1 and VT2, how the setting T2=K·T1$^2$ is achieved will be described.

First, the charge voltages VT1 and VT2 are given by formulae (5a) and (5b) below respectively.

[Formula 5]

$$VT1 = \frac{I1 \cdot T1}{C1} \tag{5a}$$

$$VT2 = \frac{I2 \cdot T2}{C2} \tag{5b}$$

The second time T2 is the time required by the charge voltage VT2 to reach the charge voltage VTI; hence, using formulae (5a) and (5b) above, the second time T2 is given by formula (6) below.

[Formula 6]

$$T2 = VT2 \cdot \frac{C2}{I2} = VT1 \cdot \frac{C2}{I2} = \frac{I1}{I2} \cdot \frac{C2}{C1} \cdot T1 \tag{6}$$

Here, the charge current I1 is a sawtooth-wave current that varies in accordance with the first time T1, and using a coefficient AI1 (corresponding to the gradient of the charge current I1), the charge current I1 is given by formula (7) below.

$$I1 = \Delta I1 \cdot T1 \tag{7}$$

Thus, with formula (7) substituted in formula (6), the second time T2 is given by formula (8) below.

[Formula 8]

$$T2 = \frac{\Delta I1 \cdot T1}{I2} \cdot \frac{C2}{C1} \cdot T1 = K \cdot T1^2 \tag{8}$$

$$\left( * K = \frac{\Delta I1}{I2} \cdot \frac{C2}{C1} \right)$$

In this way, from the first time T1, which is determined externally, the second time T2 is set in accordance with internal parameters of the power IC 100. As will be clear from formula (8) above, the second time T2 is set at a length ($=K \cdot T1^2$) proportional to the square of the first time T1.

Figure 9:
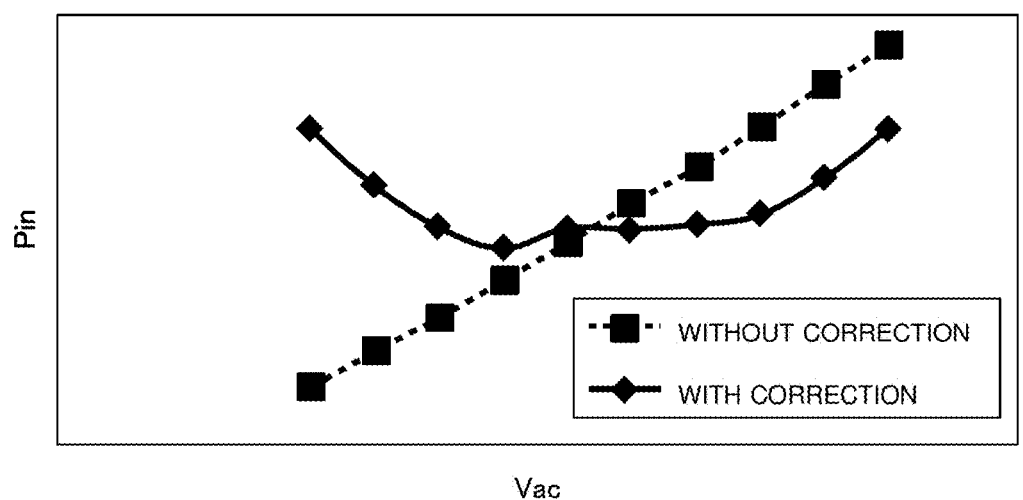
FIG. 9 is a diagram showing a correlation between an alternating-current input voltage and a maximum input power.

FIG. 9 is a diagram showing the correlation between the alternating-current input voltage Vac and the maximum input power Pin. In the diagram, a broken line passing through square markers indicates the correlation observed when the input voltage dependence of the effective threshold value is not corrected (i.e., in a configuration without the variable retarder 220 introduced). On the other hand, a solid line passing through lozenge markers indicates the correlation observed when the input voltage dependence of the effective threshold value is corrected (i.e., in a configuration with the variable retarder 220 introduced).

As will be clear from the comparison between the solid line and the broken line, adopting the current limiter 200 described previously makes it possible to keep the maximum input power Pin generally constant without dependence on the alternating-current input voltage Vac (and hence the direct-current input voltage Vi).

<Applications>

Lastly, uses of the isolated switching power supply 1 will be described. The isolated switching power supply 1 is used suitably as a power supply block in an AC adaptor or an electronic appliance.

Figure 10:
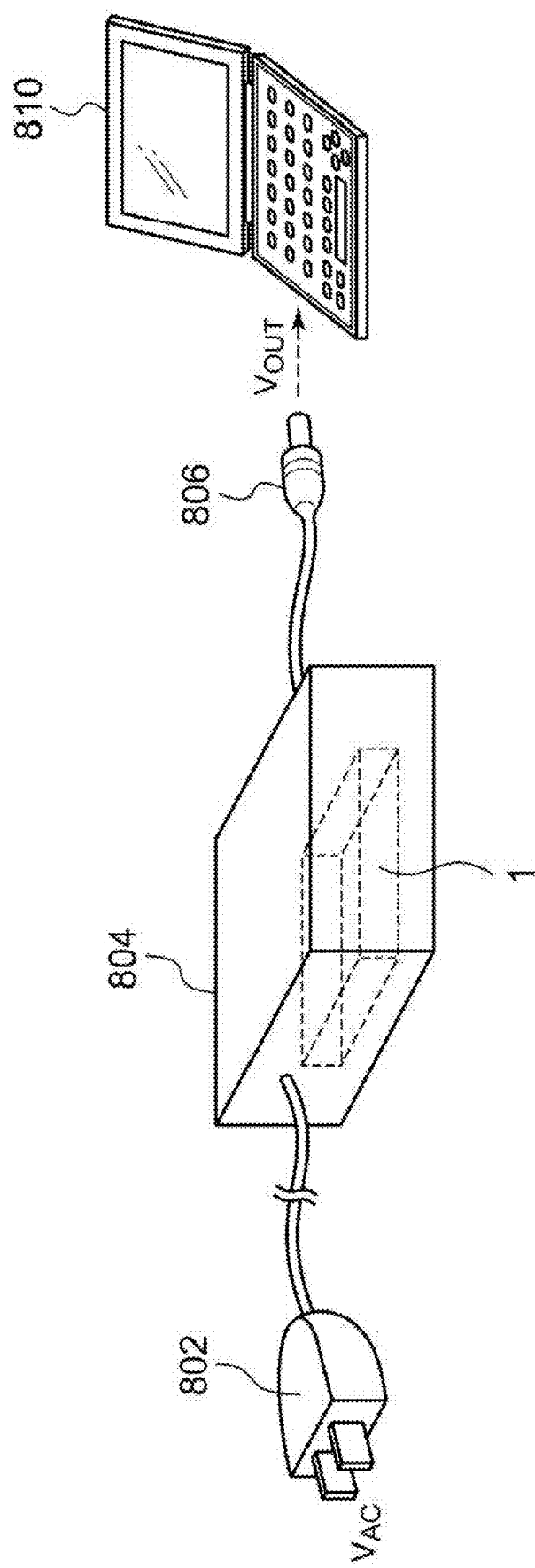
FIG. 10 is an exterior view of an AC adapter incorporating an AC-DC converter.

FIG. 10 is an exterior view of an AC adaptor 800 incorporating the isolated switching power supply 1. The AC adaptor 800 includes a plug 802, a housing 804, and a connector 806. The plug 802 receives a commercial alternating-current voltage VAC (corresponding to the alternating-current input voltage Vac in FIG. 1) from a wall outlet (not shown). The direct-current output voltage VOLT (corresponding to the direct-current output voltage Vo in FIG. 1) generated by the isolated switching power supply 1 is supplied via the connector 806 to an electronic appliance 810. Examples of the electronic appliance 810 include notebook personal computers, digital cameras, digital video cameras, mobile telephones, and portable audio players.

Figure 11A:
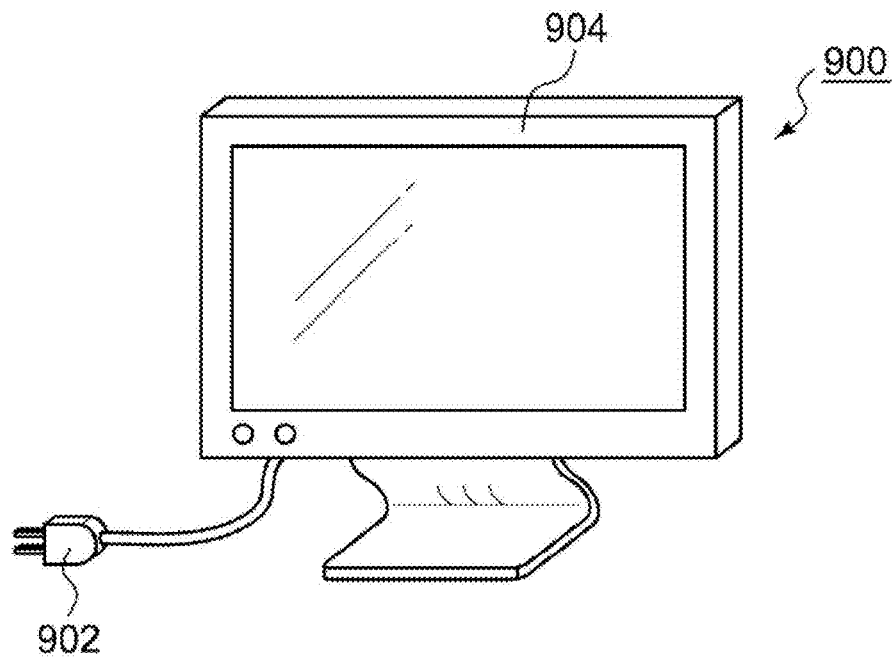
FIG. 11A is an exterior view (front view) of an electronic appliance incorporating an AC-DC converter.
Figure 11B:
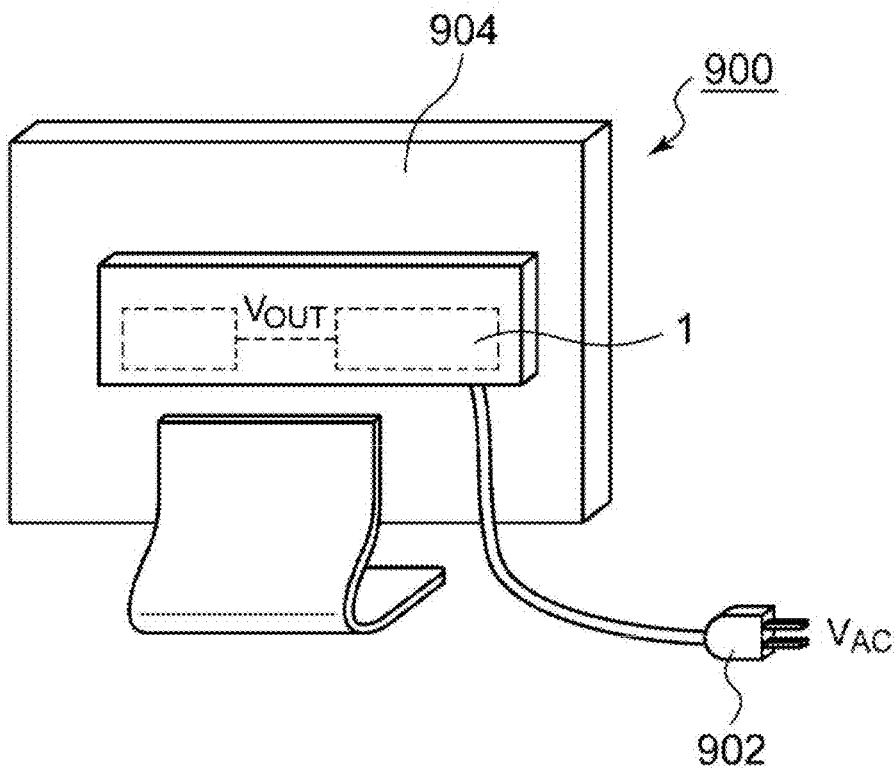
FIG. 11B is an exterior view (rear view) of an electronic appliance incorporating an AC-DC converter.

FIGS. 11A and 11B are exterior views (a front view and a rear view respectively) of an electronic appliance 900 incorporating the isolated switching power supply 1. While the electronic appliance 900 shown as an example in FIGS. 11A and 11B is a display device, the electronic appliance 900 can be of any other kind so long as it incorporates a power supply, examples including audio appliances, refrigerators, washing machines, and vacuum cleaners.

A plug 902 receives a commercial alternating-current voltage VAC from a wall outlet (not shown). The isolated switching power supply 1 is arranged inside a housing 804. The direct-current output voltage VOLT generated by the isolated switching power supply 1 is supplied to a load arranged inside housing 904, such as a microcomputer, a DSP (digital signal processor), a power supply circuit, an illuminating device, an analog circuit, or a digital circuit.

<Terminal Arrangement>

Figure 12:
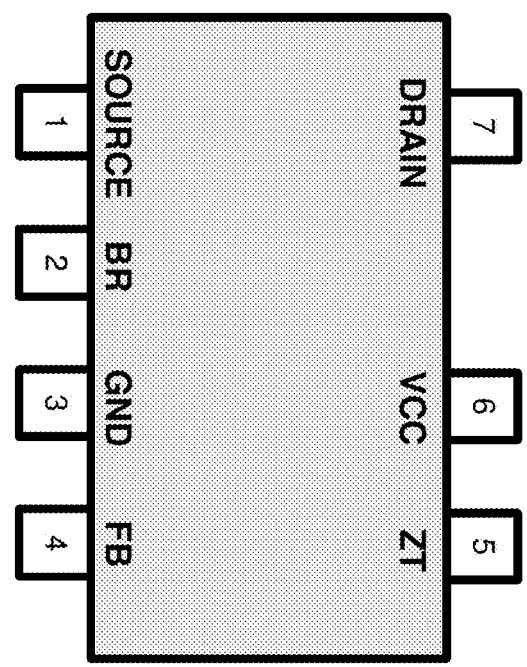
FIG. 12 is a terminal arrangement diagram of a power IC.

FIG. 12 is a terminal arrangement diagram (top view) of a power IC. The power IC 100A shown there results from incorporating the output switch 22 in the power IC 100 described previously. The power IC 100A includes, as means for establishing electrical connection with the outside, seven external terminals (SOURCE, BR, GND, FB, ZT, VCC, and. DRAIN).

Pin-1 (SOURCE) is the source terminal of the output switch 22, and is disposed in one-end part along a first side of the package (i.e., in FIG. 12, in an upper end part along the left side of the package).

Pin-2 (BR) is a terminal for detection of the alternating-current input voltage Vac (in practice, the direct-current input voltage Vi), and is disposed adjacent to pin-1 and pin-3 along the first side of the package.

Pin-3 (GND) is a ground terminal, and is disposed adjacent to pin-2 and pin-4 along the first side of the package.

Pin-4 (FB) is a terminal for input of a feedback signal (i.e., the feedback current Ifb), and is disposed in an other-end part along the first side of the package (i.e., in a lower end part along the left side of the package).

Pin-5 (ZT) is a terminal to which an auxiliary winding of the transformer 21 is connected, and is disposed in one-end part along a second side of the package (i.e., in a lower end part along the right side of the package). That is, pin-5 (ZT) is disposed at a position opposite from pin-4 (FB).

Pin-6 (VCC) is a supply power terminal, and is disposed adjacent to pin-5 along the second side of the package. That is, pin-6 (VCC) is disposed at a position opposite from pin-3 (GND).

Pin-7 (DRAIN) is the drain terminal of the output switch 22, and is disposed in an other-end part along the second side of the package (i.e., in an upper end part along the right side of the package). That is, pin-7 (DRAIN) is disposed at a position opposite from pin-1 (SOURCE). In this way, the source terminal and the drain terminal of the output switch 22 are arranged separately, one at the first side and the other at the second side of the package, and this facilitates the laying-out of the wiring pattern on the PCB (printed circuit board). Along the second side of the package, no external terminal is disposed at the position opposite from pin-2 (BR). Accordingly, the pin interval between pin-6 (VCC) and pin-7 (DRAIN) is longer than the pin intervals elsewhere. This terminal arrangement makes nearby-pin short-circuiting between those two pins less likely.

<Other Modifications>

The various technical features disclosed herein can be implemented in any other manner than in the embodiments described above, and allow for many modifications without departing from the spirit of the present invention. For example, while the above embodiment deals with examples where a current sense circuit is used for overcurrent protection, it can be used in any other applications (such as output feedback control of a peak current mode control type).

That is, the embodiment descried above should be understood to be in every aspect illustrative and not restrictive. The technical scope of the present invention is defined not by the description of the embodiments given above but by the appended claims, and should be understood to encompass any modifications made in the sense and scope equivalent to those of the claims.

INDUSTRIAL APPLICABILITY

An isolated switching power supply according to what is disclosed herein can be used as power supplying means in, for example, AC adaptors and electronic appliances.

REFERENCE SIGNS LIST 1 isolated switching power supply
1p primary circuit system (GND1 system)
1s secondary circuit system (GND2 system)
2 load
10 rectifier
11 filter
12 diode bridge
13, 14 capacitor
20 DC-DC converter
21 transformer
211 primary winding
212 secondary winding
22 output switch (N-channel MOS field-effect transistor)
23 sense resistor
24 diode
25 capacitor
100, 100A power IC
110 controller
111 RS flip-flop
112 OR gate
120 driver
130 resistor
140 oscillator
150 adder
160 comparator
170 maximum duty setter
200 current limiter (corresponding to a current sense circuit)
210 comparator
220 variable retarder
221, 222 RS flip-flop
223, 224 timer
225 inverter
230 masking processor
231 N-channel MOS field-effect transistor
232 switch
233 inverter
800 AC adaptor
802, 902 plug
804, 904 housing
806 connector
810, 900 electronic appliance
PW commercial alternating-current power source
X electronic appliance
CS1, CS2 current source
SW1, SW2 switch
INV1, INV2 inverter
C1, C2 capacitor
N1, N2 N-channel MOS field-effect transistor
CMP comparator
Pa, Pb P-channel MOS field-effect transistor
Na N-channel MOS field-effect transistor
Ra resistor
AMP operational amplifier

The invention claimed is:

1. A current sense circuit comprising:
a comparator configured to turn a comparison signal from a first logic level to a second logic level when a monitoring target current passing in an output switch reaches a predetermined threshold value; and
a variable retarder configured to count a first time from turning-on of the output switch to turning of the comparison signal to the second logic level and to generate a current sense signal by delaying the comparison signal by a second time proportional to a square of the first time.

2. The current sense circuit according to claim 1, wherein the variable retarder includes:
a first timer configured to count the first time; and
a second timer configured to generate the current sense signal by delaying the comparison signal by the second time.

3. The current sense circuit according to claim 1, wherein the variable retarder includes:
a first capacitor from between terminals of which a first charge voltage is extracted;
a first charger configured, after the turning-on of the output switch, to charge the first capacitor with a first charge current with a sawtooth waveform;
a first discharger configured, before charging of the first capacitor, to discharge the first capacitor;
a second capacitor from between terminals of which a second charge voltage is extracted;
a second charger configured, after the turning of the comparison signal to the second logic level, to charge the second capacitor with a predetermined second charge current;
a second discharger configured, before charging of the second capacitor, to discharge the second capacitor; and
a charge voltage comparator configured to generate the current sense signal by comparing the first and second charge voltage with each other.

4. The current sense circuit according to claim 3, wherein the first charger includes, as a means for generating the first charge current:
a voltage-to-current converter configured to convert a sawtooth-wave voltage into a sawtooth-wave current; and
a current mirror configured to generate the first charge current by mirroring the sawtooth-wave current.

5. A power IC comprising, in a form integrated together:
the current sense circuit according to claim 1; and
a controller configured to control the output switch in accordance with the current sense signal.

6. A switching power supply comprising:
the power IC according to claim 5;
wherein the output switch is controlled by the power IC.

7. The switching power supply according to claim 6, comprising:
a DC-DC converter configured, while electrically isolating a primary circuit system and a secondary circuit system from each other with a transformer, to generate from a direct-current input voltage supplied to the primary circuit system a direct-current output voltage to supply the direct-current output voltage to a load in the secondary circuit system,
wherein the power IC and the output switch function as constituent elements of the DC-DC converter.

8. The switching power supply according to claim 7, further comprising:
a rectifier configured to generate the direct-current input voltage from an alternating-current input voltage.

9. An AC adaptor comprising:
the switching power supply according to claim 8.

10. An electronic appliance comprising:
the switching power supply according to claim 8; and
a load configured to operate by being supplied with electric power from the switching power supply.

* * * * *